United States Patent [19]

Graham

[11] 4,309,331

[45] Jan. 5, 1982

[54] SURFACTANT-FREE ACRYLIC PLASTISOLS AND ORGANOSOLS COMPOSITIONS

[75] Inventor: Boynton Graham, Wilmington, Del.

[73] Assignee: E. I. Du Pont de Nemours and Company, Wilmington, Del.

[21] Appl. No.: 952,467

[22] Filed: Oct. 18, 1978

Related U.S. Application Data

[63] Continuation of Ser. No. 780,085, Mar. 22, 1977, abandoned.

[51] Int. Cl.$^3$ .................. C08F 20/14; C08F 2/14; C08L 33/12; C08F 2/44
[52] U.S. Cl. .................. 260/30.6 R; 260/31.8 R; 260/31.8 M; 260/31.8 XA; 260/34.2; 204/159.15; 204/159.16; 430/256; 430/264; 430/288; 428/402; 428/407; 526/201; 526/224; 526/317; 526/909
[58] Field of Search ............... 428/402, 407; 526/909, 526/224, 317, 201; 260/31.8 R, 31.8 M, 31.8 XA, 30.6 R, 29.6 H, 29.6 MP, 34.2; 204/159.16, 159.15; 96/115 P, 115 R

[56] References Cited

U.S. PATENT DOCUMENTS

| | | | |
|---|---|---|---|
| 2,600,122 | 6/1952 | Meyer et al. | 260/34.2 |
| 2,618,621 | 11/1952 | Burt | 260/31.4 |
| 3,469,982 | 9/1969 | Celeste | 430/256 |
| 3,701,747 | 10/1972 | Osmond et al. | 260/33.6 |
| 3,778,403 | 12/1973 | Walus | 260/34.2 |
| 3,850,871 | 11/1974 | Walus et al. | 260/31.6 |
| 3,852,096 | 12/1974 | Lundberg et al. | 117/47 |
| 3,925,280 | 12/1975 | Lundberg et al. | 260/23 R |
| 4,071,653 | 1/1978 | Boessler et al. | 428/332 |
| 4,173,558 | 11/1979 | Beck | 260/34.2 |

FOREIGN PATENT DOCUMENTS

| | | |
|---|---|---|
| 835444 | 5/1976 | Belgium . |
| 846793 | 4/1977 | Belgium . |
| 1050683 | 11/1975 | Canada . |
| 2454235 | 5/1976 | Fed. Rep. of Germany . |
| 2543542 | 4/1977 | Fed. Rep. of Germany . |
| 7306503 | 5/1973 | France . |

OTHER PUBLICATIONS

Derwert. 39956 X/22 "Acrylic . . .Plastisols . . .".
Rheology of Sterically Stabilized Dispersions of Poly(-methyl methacrylate) in Aliphatic Hydrocarbons by Walbridge and Waters, Discuss. Faraday Soc. 42, pp. 294–300 (1966).
Control of Dilatational Properties of Poly(Methyl Methacrylate) Plastisols in Dibutyl Phthalate by Yu. V. Ovchinnikov et al., Khimiya i khimicheskaya tekhnologiya, Trudy 1972, pp. 51–55, No. 1.
Agglomeration of Polymeric Particles During the Spray Drying of Latexes by V. M. Ul'yanov et al., Khimiya i khimicheskaya tekhnologiya, Trudy 1972, pp. 78–82, No. 3.
Polymer Processes, High Polymers, vol. X, C. E. Schildnecht, Interscience Publishers, Inc., New York, N.Y. (1956), pp. 58–62.
Some Rheological Properties of Poly(Methyl Methacrylate Suspensions in Dibutyl Phthalate by Bubis et al., Kolloidnyi Zhurnal, 1972, vol. 34, No. 5, pp. 757–760 (pp. 661–663 in English version).
Plastisols and Organosols, H. A. Sarvetnick, Van Nostrand Reinhold Company, New York, N.Y., 1972, pp. 33–59.
Sorenson and Campbell, "Preparative Methods of Polymer Chemistry", Interscience Publishers, New York (1968), p. 216.
Fred W. Billmeyer, Jr., "Textbook of Polymer Science", Interscience Publishers, New York (1964), pp. 342–343.
Paul J. Flory, "Principles of Polymer Chemistry", Cornell University Press, Ithaca (1953), p. 203.

*Primary Examiner*—Herbert J. Lilling

[57] ABSTRACT

Thermally coalescible acrylic resin dispersions comprising particles of single-phase, surfactant-free, random acrylic polymers or copolymers, containing at least 80% by weight of acrylic units, dispersed in a surfactant-free medium that comprises a compatible liquid plasticizer that is nonvolatile at room temperature and is not a monomer of any of the polymeric components. Incorporation of a photopolymerizable, ethylenically unsaturated compound provides photosensitive dispersions useful for making relief and planographic printing plates, photoresists, and the like.

7 Claims, No Drawings

SURFACTANT-FREE ACRYLIC PLASTISOLS AND ORGANOSOLS COMPOSITIONS

This is a continuation of application Ser. No. 780,085 filed Mar. 22, 1977, and now abandoned.

BACKGROUND OF THE INVENTION

1. Field of the Invention

This invention relates to nonaqueous acrylic resin dispersions and particularly to acrylic resin plastisols and organosols. This invention also relates to acrylic resin dispersions containing photopolymerizable ethylenically unsaturated compounds.

2. Description of the Prior Art

Certain polymeric resin dispersions referred to as plastisols are fluid mixtures, ranging in viscosity from pourable liquids to heavy pastes, obtained by dispersing polymeric resin particles in nonvolatile, nonaqueous liquid plasticizers, i.e., materials which are compatible with the polymer or resin and increase its workability and flexibility but are not solvents for the polymeric resin under ordinary conditions of storage. When the plastisol has been formed into a desired shape, e.g., by molding or coating, it can be heated to coalesce the polymeric resin particles and the nonvolatile liquid constituent, thereby forming a homogeneous mass. Theoretically, by appropriate choice of ingredients, any polymeric resin can be made into a plastisol. In practice, however, both the commercial use and the technical literature have focused almost exclusively on the use of polyvinyl chloride in forming plastisols, to the extent that "plastisol" is cross-reference to "polyvinyl chloride" in *Chemical Abstracts* and in many textbooks plastisols are described as suspensions of polyvinyl chloride resin. Volatile diluents can be added to plastisol dispersions to modify their viscosity and to achieve desirable handling characteristics in coating or other forming operations. When the dispersion contains no more than 10% volatile diluent, it is still regarded as a plastisol; when the volatile diluent content exceeds 10%, however, the dispersion is regarded as an "organosol", H. A. Sarvetnick, "Plastisols and Organosols", Van Nostrand Reinhold Company, New York (1972), page 201.

Polyvinyl chloride plastisols are known wherein the polyvinyl chloride is copolymerized with other monomers, including acrylic monomers, that constitute a minority (<35% by weight) of the polymer composition. In U.S. Pat. No. 2,618,621 there are disclosed polyvinyl chloride plastisols wherein part of the plasticizer content is replaced with an acrylic monomer, which is then conventionally thermally polymerized at the temperature encountered in the step of coalescing the polyvinyl chloride resin. French Pat. No. 73.06503 discloses plastisols prepared from a variety of polymers, primarily of the styrene family, with the requirements that the polymers be multiple phase and that they be dispersed in polar plasticizers.

It has now been found possible to prepare plastisols based on acrylic polymers that are amenable to a variety of forming techniques with all of the economic, ecological, health and safety advantages attendant on solvent-free operation. The acrylic resin compositions may be either plastisols or organosols, depending on the amount of volatile diluent included, if any.

SUMMARY OF THE INVENTION

In accordance with this invention, thermally coalescible acrylic resin dispersions are prepared which comprise particles of a single-phase, surfactant-free, random acrylic polymer or copolymer, containing at least 80% by weight of acrylic units, dispersed in a surfactant-free medium that comprises a compatible liquid plasticizer that is nonvolatile at room temperature and is not a monomer of any of the polymeric components.

DESCRIPTION OF THE PREFERRED EMBODIMENTS

The polymers suitable for use as the resin component in the dispersions of this invention are the single-phase polymers and copolymers of acrylic and methacrylic acids and their esters, i.e., polymers in which only one phase is present in the polymer particles, as evidenced by the fact that films cast from solutions of the polymers are clear. The polymers ma be homopolymers of a given acrylic monomer or they may be copolymers made from two or more acrylic monomers. Also suitable are copolymers made by copolymerizing one or more acrylic monomers with one or more other ethylenically unsaturated monomers, e.g., vinyl chloride, styrene, the vinyl pyridines, and the like, so long as acrylic units comprise at least 80% by weight of the composition of the final polymer. Representative materials are the homopolymers and the two- and three-component copolymers of ethyl acrylate, methyl methacrylate, and methacrylic acid. A number of suitable combinations are illustrated in the examples hereinafter. Particularly preferred materials are the methyl methacrylate/methacrylic acid copolymers in the ratios, by weight, of 80/20 to 99/1 and more preferably 90/10 to 98/2. The polymers may be prepared by any of the methods familiar to polymer cheimsts, e.g., by emulsion, suspension, or seed polymerization. Several useful techniques are illustrated in the examples that follow. The method of making the polymer is not a part of the present invention, but will, as recognized, have an effect on such characteristics as the inherent viscosity of the polymer and the size of the polymer particles produced. The inherent viscosity ($\eta_{inh}$) of the polymer is not a critical factor, but for convenient practical operation will preferably be in the range 0.1–1.5 and more preferably 0.2–1.2. When polymer viscosity is high; the composition will be more difficult to coalesce; when polymer viscosity is low, the form stability of the final coalesced product may be affected adversely. Particle size, expressed as mean diameter of the particles, is likewise not critical, but for convenient practical operation will preferably be in the range 0.1–20 $\mu$m and more preferably 0.5–10 $\mu$m. The desirable particle size in a given instance will be governed in part by the characteristics sought in the final product and by the forming procedures to be employed. Very small particles, e.g., <0.1 $\mu$m, are operable, but their large available surface area tends to make them susceptible to rapid gelation with consequent short storage life, and to require large amounts of plasticizer that result in low solids/liquid ratios that are inefficient and undesirable for practical operations. Very large particles may limit the minimum thickness of coatings that can be made from dispersions containing them, and may also require fusion or coalescence times that are unattractively long and/or severe. Particle sizes in the desired range in a given instance may be obtained either directly, by choice of an appropriate polymerization procedure, or by grinding or milling large particles to produce smaller ones, in equipment and by techniques known in the art. To improve the rheology of the dispersions, it may be desirable to pretreat the polymer particles, for example, by exposure to ammonia, as described more fully in the examples hereinafter. The polymer particles must be surfactant-free.

To make the dispersions of this invention, the polymer particles will be dispersed in a medium that comprises a plasticizer for the polymer particles, that is, a surfactant-free compatible liquid that is nonvolatile at room temperature and is not a solvent for the polymer under ordinary storage conditions, but that is capable of interacting physically with the polymer in such a way as to reduce the mutual attractive forces between polymer chains, thereby increasing the workability and flexibility of the polymer. The plasticizer is also not a monomer of any of the polymeric components. The plasticizer can be chosen from a large number of substances known to be plasticizers for polymers, e.g., phosphates, phthalates, sebacates, ricinoleates, adipates, etc. Plasticizers are discussed in Sarvetnick, "Plastisols and Organosols", Van Nostrand Reinhold Company, New York, New York (1972), Chapter 3, pp. 38–59. Representative materials include: triallyl, tributyl and tricresyl phosphates; dibutyl, dicapryl, and dioctyl phthalates; and others shown in the examples hereinafter. Plasticizers that contain ether groups are operable, but generally are not preferred because they appear to have an adverse effect on viscosity stability and shelf life of the polymer dispersions.

The dispersing medium may also contain a volatile component, preferably one that is a solvent or swelling agent for the acrylic polymer or copolymer component of the dispersion. Incorporation of a volatile component provides an additional means of controlling the viscosity of the dispersion and may frequently facilitate the forming operation, e.g., coating, and improve the rheology of the dispersion. Representative materials are methyl chloroform, chloroform, methylene chloride, and others shown in the examples. Following known practice, dispersions wherein the volatile component comprises up to 10% by weight of the total weight of the dispersion are classified as plastisols, whereas dispersions wherein the volatile component comprises more than 10% by weight of the total weight of the dispersion are classified as organosols.

The loading factor or amount of polymer solids in the liquid dispersing medium will be governed by practical factors relating to operating convenience. For coatability, ease of stirring, and the like, a practical upper limit for the solids/nonvolatile liquid plasticizer ratio is 60/40, and more preferred is about 50/50, for the plastisol dispersions. This consideration is less important for the organosol dispersions, where solids/nonvolatile liquid plasticizer ratios of 80/20 and even 90/10 are feasible, inasmuch as any desired amount of volatile component can be incorporated to give a workable viscosity and then removed by evaporation by heating in the course of arriving at the desired temperature for fusing or coalescing the dispersion.

For the photosensitive dispersions and elements that are a particularly preferred embodiment of this invention, the liquid portion of the dispersion will contain a nonvolatile photopolymerizable, ethylenically unsaturated compound together with any required or desired photoinitiator component(s), chain transfer agents, hydrogen donors, dyes and other conventional additives, all selected from the many materials known for their respectively purposes in the photopolymer art and not forming, per se, a part of the present invention. A wide variety of suitable materials for use as photopolymerizable monomers, photoinitiators, and the other components just mentioned is disclosed in a number of patents dealing with the photopolymer art, conveniently, for example, in Gramas U.S. Pat. No. 3,784,378. Among the preferred photopolymerizable monomers are a number of polyfunctional acrylic and methacrylic monomers, such as tetraethylene glycol diacrylate and dimethacrylate, hexamethylene glycol diacrylate and dimethacrylate, polyethylene oxide diacrylate and dimethacrylate, polyethoxy trimethylolpropane triacrylate, trimethylolpropane triacrylate and trimethacrylate, tetramethylene glycol dimethacrylate, and decamethylene glycol dimethacrylate. Monomers that contain ether groups are operable, but ether-free monomers are preferred for viscosity stability of the plastisol. When a photopolymerizable acrylic monomer is used, it should not be a monomer of any of the already-polymerized component, i.e., the acrylic polymer resin that is dispersed in the liquid component. Thus, for example, a methyl methacrylate/methacrylic acid polymer can be dispersed in a liquid that contains trimethylolpropane trimethacrylate as one component of the liquid portion. It is important that any photopolymerizable monomer that may be included in the dispersion shall also contain a thermal polymerization inhibitor in an amount adequate to prevent premature polymerization of the monomer in response to the heat that may be encountered in stirring and especially in the coalescence step, thereby insuring that polymerization of the monomer occurs only as a consequence of photoexposure of the completed photosensitive element. The commercially available polymerization-grade monomers conventionally contain thermal polymerization inhibitors in an amount adequate for this purpose.

The acrylic plastisols and organosols of the invention may be formed into articles by any of the forming procedures ordinarily used, e.g., by coating, extrusion, molding and dipping. The forming method is not within the scope of the present invention. In the preferred embodiment of photosensitive elements, the dipsersions of the invention may be cast or extruded to form self-supporting elements, or they may be cast or coated on transparent or nontransparent substrates to form supported photosensitive elements. A number of suitable substrates are disclosed in the examples hereinafter and in the aforementioned Gramas, U.S. Pat. No. 3,784,378, and are otherwise well known to those familiar with the general art of photosensitive elements. The particular substrates used and the particular structure of photosensitive elements or other objects formed from the dispersions of the invention are not part of the invention.

Acrylic polymers and copolymers can be dispersed in a variety of compatible liquid media to form fluid plastisols having solids/liquid ratios of 50/50 or greater. Diluents can be added to these dispersions to give organosols that may have substantially higher ratios of solids to liquid, and, for both plastisols and organosols, there may be incorporated a variety of photopolymerizable monomers to permit the formation of photoimageable coatings and the like, useful for a variety of applications, such as relief and planographic printing plates, photoresists, etc.

EXAMPLES OF THE INVENTION

The invention will be illustrated by the examples that follow, wherein parts and percentages are by weight unless otherwise noted. Data on the inherent viscosity of polymers ($\eta_{inh}$) refer to the inherent viscosities of solutions of 0.25 g polymer in 50 ml solvent, either chloroform or 50/50 (by volume) chloroform/methanol, measured at 25° C. with a No. 50 Cannon-Fenske viscometer. Particle size values are mean particle diameters determined by inspection of photomicrographs or electron micrographs. Dispersion viscosities, reported in centipoises (cp.), were measured with a Brookfield RVT viscometer with a No. 5 spindle. All monomers used in the examples, either to make the acrylic polymers or to serve as photopolymerizable monomers in photosensitive compositions, were commercially available polymerizationgrade monomers containing conventional amounts of polymerization inhibitors. Dyes are identified, in some instances, by C.I. name and number as given in "Colour Index", Third Edition, The Society of Dyers and Colourists, Bradford, Yorkshire, England (1971). Performance of photosensitive elements was measured in part by exposing them through a conventional graphic arts resolution guide, i.e., a series of transparent parallel lines of known width in a nontransparent background, and a series of transparent converging lines separated by nontransparent spacing areas of known width, then removing the unpolymerized composition from the unexposed areas. Performance is expressed in the examples in terms of the minimum width of polymerized parallel lines that could be faithfully reproduced, and of the minimum spacing that could be obtained without plugging between polymerized converging lines. Filters and sieves are identified in terms of mesh (number of openings per inch) and sieve opening (mm or $\mu$m) according to Table 21-16 on page 21-51 of Perry, "Chemical Engineers' Handbook", Fourth Edition, McGraw-Hill Book Company, New York (1963).

EXAMPLE 1

To a solution of 0.4 g ammonium persulfate in 200 g of water was added 18 ml of a solution of 1.09 g dodecyl mercaptan and 10.0 g methacrylic acid in 100 g methyl methacrylate. The suspension was stirred vigorously under nitrogen and heated to 80°–85° C. At 30-minute intervals, there was added 25 ml of the methyl methacrylate/methacrylic acid/dodecyl mercaptan solution and 112 ml of a solution of 0.2 g ammonium persulfate in 450 g water. Thirty minutes after the fourth such addition, the reactor was opened to air and cooled to room temperature. The latex that had been produced was evaporated at 55°–66° C. under nitrogen with stirring, and the residual powder was ground in a mortar, passed through a 40-mesh (~0.38 mm) sieve, and held for 3 days in a closed container over concentrated ammonium hydroxide. The powder was soluble at room temperature in chloroform and 1,1,2-trichloromethane; partly soluble, swollen and agglomerated in methylene chloride, 1,2-dichloroethane, trichloroethylene and 1,2,3-trichloropropane. It was swollen but insoluble in methyl chloroform, perchloroethylene and carbon tetrachloride. It was insoluble and not swollen in hexane.

A plastisol was prepared by mixing equal parts by weight of the powder, prepared by just described, with dibutyl phthalate. The resultant soft translucent paste was spread at 1 mm thickness on glass and coalesced by heating for five minutes at 120° C. to give a clear, dry, soft, pliable film.

EXAMPLE 2

One part of polymer powder prepared as in Example 1 was mixed with 0.6 part of a commercially available polyoxyethylated long chain alcohol, 0.2 part of a commercially available polyoxyethylene sorbitan monolaurate, and 0.2 part of methylene-bis-(4-cyclohexyl isocyanate). The resultant white paste was spread on glass at 1 mm thickness and heated for 5 minutes at 120° C. It coalesced to give a clear, soft film that swelled 12.5% by volume when immersed in 5% aqueous sodium carbonate. The product was suitable for use as a binder for silver halide photographic systems. This example illustrates a crosslinkable formulation.

EXAMPLES 3–5

These examples illustrate useful upper limits for loading factor for acrylic resin plastisols, and they also show that, for a given polymer and plasticizer, relatively small changes in the solids/liquid ratio can have a rather large effect on plastisol rheology. In addition, these examples illustrate a decrease in viscosity upon aging that has been found to be characteristic of plastisols made from methyl methacrylate/methacrylic acid (90/10) copolymers. For the dispersions of these examples, a polymer like that of Example 1 was mixed with dibutyl phthalate by conventional high-speed sand-milling procedures. All formulations also contained 0.2% benzotriazole and 0.07% C.I. Solvent Red 109 (C.I. No. 13900/45170). Good filterability was achieved by adding a small amount of methyl chloroform, which was subsequently removed by evacuation after filtration to give substantially solvent-free plastisols. The viscosity of the dispersions was determined at high and low shear by varying the rotational velocity of a No. 5 spindle in a Brookfield RVT viscometer, with the results shown in Table 1. Viscosities were determined for the freshly prepared plastisols and again after aging at room temperature (1 day for Example 3; 3 days for Example 4). The plastisol of Example 5 was very shear-sensitive and set to a firm paste at room temperature when stirred rapidly. The plastisols of Examples 3 and 4 were dilatant at high shear and thixotropic at low shear. They were cast and coalesced as described for preceding examples to give clear, pliable films.

TABLE 1

| | Example | | | | |
|---|---|---|---|---|---|
| | 3 | | 4 | | 5 |
| Sol./liq. | 58/42 | | 59/41 | | 60/40 |
| Visc., cps. | Initial | Aged | Initial | Aged | Initial |
| at 50 rpm | 6,000 | 2576 | — | — | — |
| 20 rpm | 7,780 | 2040 | 16,200 | 2,000 | — |
| 10 rpm | 11,600 | 2720 | 20,240 | 2,400 | — |
| 5 rpm | 17,600 | 3760 | 30,240 | 3,440 | 40,000 |
| 1 rpm | — | — | 105,000 | 9,600 | — |

EXAMPLE 6

A methyl methacrylate/methacrylic acid (90/10) copolymer ($\eta_{inh}=0.12$) was made by conventional suspension polymerization in polymethacrylic acid as the suspending agent. The resultant spherical particles were about 100–125 $\mu$m in diameter. The polymer was drymilled in a ball mill with an equal volume of flint pebbles having a diameter of ~12.5 mm for four days. The resultant product was an impalpable powder of 2-20 μm particle size. The powder was soluble at room temperature in methylene chloride, chloroform, 1,2-dichloroethane, trichloroethylene, 1,1,2-trichloroethane and 1,2,3-trichloropropane. It was partly soluble, swollen and agglomerated in methyl chloroform, insoluble but swollen in perchloroethylene and carbon tetrachloride, and insoluble but not swollen in hexane.

An 11.1 g sample of the powder was added to a blend of 8.75 g trimethylolpropane triacrylate, 4.00 g di-2-ethylhexyl phthalate, 1.00 g 2-o-chlorophenyl-4,5-(m-methoxyphenyl)-imidazolyl dimer, 0.05 g leuco crystal violet, 0.05 g benzotriazole, 0.0125 g Michler's ketone and 0.0375 g C.I. Solvent Red 109 (C.I. No. 13900/45170). This mixture was stirred for 15 minutes at room temperature to give a fluid plastisol with a Brookfield No. 5 viscosity of 8700 cps. It was spread on 25 μm thick polyethylene terephthalate film with a doctor knife set at 0.1 mm and heated for five minutes at 120° C. The plastisol coalesced to a smooth, clear, continuous film having a thickness of 0.05 mm when cooled.

The film was laminated at 100° C. to a copper-foil-coated phenolic circuit board and exposed through a graphic arts resolution guide as previously described for one minute to radiation from a commercially available pulsed xenon source. The polyethylene terephthalate support was then removed, and the exposed coating was developed by extracting with a solution of 10 g of the monobutyl ether of ethylene glycol plus 1 g of borax in 90 g of water. The exposed areas had good image retention. Isolated lines having a width of 100 μm were reproduced, and there was no line plugging at resolutions of 75-100 μm. The board could be clearly and sharply etched with commercial ferric chloride etchant solutions, and stripped with methylene chloride.

The plastisol had good stability; viscosity was 16,000 cps. after standing for one day at room temperature. By contrast, a similar plastisol made with a polyether-based plasticizer, triethylene glycol diacetate, instead of the di-2-ethylhexyl phthalate, had an initial viscosity of 13,700 cps. and this increased to >800,000 cps. after one day at room temperature.

When the unground 100-125 μm suspension polymer was used to make a similar plastisol, the product could not be spread to a uniform film, even at a knife clearance of 0.15 mm, and thicker coatings could not be uniformly coalesced, even after 20 minutes at 120° C.

EXAMPLE 7

A commercially available 75-125 μm suspension-polymerized poly(methyl methacrylate) homopolymer ($\eta_{inh}=0.2$) was pebble-milled as described in Example 6 to give 2-20 μm particles, which were used to make a sand-milled plastisol (solids/liquid = ~45/55) with the ingredients described in Example 6, except that the di-2-ethylhexyl phthalate was replaced by tricresyl phosphate/dibutyl phthalate (1/1). An equal volume of 20-30 mesh (~0.55-0.85 mm) sand was added to a premix of the ingredients and the mixture was stirred at 0° C. for 30 minutes with a disc stirrer running at a peripheral speed of ~300 m/min. It was then pressure-filtered through a 200-mesh (74 μm) screen and debubbled by evacuation. The resultant plastisol had a viscosity of 6000 cps. It was spread, coalesced, laminated and exposed as described in Example 6. It was developed for 15 seconds in a spray of methyl chloroform at room temperature. A sharp, clean image was retained. The image was etched and stripped as described in Example 6.

When a conventional, commercially available poly(methyl methacrylate) latex polymer of particle size <0.1 μm was isolated by drying at room temperature and comminuted by ball-milling, flowable plastisols could be prepared only at solids/liquid ratios below about 27/73. This demonstrates that acrylic powders of such small particle size are not suitable for the preparation of useful plastisols.

EXAMPLE 8

To a solution of 0.4 g ammonium persulfate in 200 g water was added 23.4 ml of a solution of 4.0 g of dodecyl mercaptan in 100 g of methyl methacrylate. The suspension was blanketed with nitrogen, stirred vigorously, and heated at 80°-85° C. At 30-minute intervals, there was added 20 ml of the methyl methacrylate/dodecyl mercaptan mixture plus 112 ml of a solution of 0.2 g ammonium persulfate in 450 g of water. Thirty minutes after the fourth addition, the reaction was terminated by admitting air and cooling to room temperature. The product was strained through nainsook fabric and held as a seed latex.

To a solution of 0.4 g of ammonium persulfate in 364 g of water was added 36.2 g of the seed latex described above, 32 ml of a solution of 4.0 g dodecyl mercaptan, and 2.0 g of methacrylic acid in 98 g of methyl methacrylate. The suspension was blanketed with nitrogen, stirred vigorously, and heated at 80°-85° C. At 30-minute intervals, there was added 20 ml of the dodecyl mercaptan/methyl methacrylate/methacrylic acid solution plus 25 ml of a solution of 0.2 g of ammonium persulfate in 100 g of water. Thirty minutes after the fourth addition, the reaction was terminated and the resultant latex was strained through glass wool and evaporated at 55°-66° C. under a stream of nitrogen with stirring.

The residue was ground in a mortar and passed through a 40-mesh (~0.38 mm) sieve to give an impalpable powder [$\eta_{inh}=0.15$ in methylene chloride/methanol (90/10)] with a glass transition temperature of 120° C. by differential scanning calorimetry. It was soluble in methyl chloroform, swollen but not dissolved by carbon tetrachloride. The residue was used to make an organosol by the procedure of Example 7 in a formulation that comprised 11.1 g of the binder powder, 8.75 g of trimethylolpropane triacrylate, 2.0 g tricresyl phosphate, 1.0 g bis(2-o-chlorophenyl-4,5-diphenyl) imidazole, 0.05 g leuco crystal violet, 0.05 g benzotriazole, 0.0375 g C. I. Solvent Red 109, 0.0825 g Michler's ketone and 5 ml chloroform diluent. After sand-milling for 30 minutes at 0° C., the mixture was held for 20 hours at 5° C., then filtered through nylon flannel at 0° C. to give an nonthixotropic dispersion that was stable at 5° C. and that could be coated, fused, laminated, exposed, developed and stripped like the product of Example 7.

EXAMPLE 9

To a solution of 0.4 g ammonium persulfate in 400 g of water was added 28.6 ml of a solution of 20 g methacrylic acid plus 1.07 g dodecyl mercaptan in 80 g of methyl methacrylate. The suspension was stirred vigorously under nitrogen and heated at 80°-85° C. At 30-minute intervals, there was added 20 ml of the methyl methacrylate/methacrylic acid/dodecyl mercaptan solution plus 25 ml of a solution of 0.2 g ammonium persulfate in 100 ml water. Thirty minutes after the fourth such addition, the reaction was terminated by admitting air and cooling to room temperature. The latex was dried at 55°–66° C. under a stream of nitrogen with stirring, and the residual powder was ground in a mortar, passed through a 40-mesh (~0.38 mm) screen and held for 20 hours in an atmosphere of ammonia. The powder was soluble in the monobutyl ether of ethylene glycol. It was insoluble in methyl chloroform, carbon tetrachloride, chloroform, methylene chloride and perchloroethylene. It was used to make an organosol as described in Example 8.

EXAMPLE 10

Ground methyl methacrylate/methacrylic acid (90/10) binder powder prepared as described in Example 6 was used to make a plastisol by the procedure of Example 7, using 12.1 g of binder powder, 7.75 g of trimethylolpropane trimethacrylate, 2.0 g tricresyl phosphate, 2.0 g dibutyl phthalate, 1.0 g bis(2-o-chlorophenyl-4,5-diphenyl) imidazole, 0.05 g leuco crystal violet, 0.05 g benzotriazole, 0.0375 g C. I. Solvent Red 109, and 0.0125 Michler's ketone. The plastisol was filtered through a 100-mesh (149 μm) screen and debubbled under vacuum. Viscosity was 28,400 cps. initially and 39,800 cps. after stirring for one day at room temperature. The plastisol was coated on 0.025 mm thick polyethylene terephthalate film under a 0.1 mm thick knife at ~1 m/min. and then passed through a 3.6 m drying oven at 105° C. Then 0.05 mm product was clear, smooth and dry. It was used to prepare printed circuit boards by the procedures of Examples 6 and 7.

EXAMPLES 11–23

Plastisols were made according to the procedure of Example 6 using the ground methyl methacrylate/methacrylic acid (90/10) powder of Example 6 in a formulation that comprised 44.4% binder powder 35% monomer, 4% triethylene glycol diacetate, 12% tricresyl phosphate, 4% 2-o-chlorophenyl-4,5-(m-methoxyphenyl) imidazolyl dimer, 0.2% leuco crystal violet, 0.2% benzotriazole, and 0.15% C. I. Solvent Red 109. Viscosities and stability varied as shown in Table 2. In general, lower initial viscosities and better stabilities were obtained for monomers that did not contain polyoxyethylene moieties, and for methacrylate as compared with acrylate monomers.

methacrylate. The suspension was stirred vigorously under nitrogen and heated at 80°–90° C. At intervals of 10, 15, 25 and 60 minutes there was added 25 ml of the dodecyl mercaptan/methacrylic acid/methyl methacrylate solution plus 112 ml of a solution of 0.20 g ammonium persulfate in 450 g of water. After a further 90 minutes at 88°–90° C., the latex was vacuum-filtered through fine filter paper, the residual filter cake was twice resuspended in water and refiltered. The final filter cake was air-dried and ground in a mortar to give an impalpable powder of acid number 63 and $\eta_{inh}=0.24$ in acetone. The powder was swollen by and partly dissolved in methylene chloride. The powder was used to prepare an organosol by the procedure of Example 7, using 11.1 g of the powder, 8.75 g trimethylolpropane trimethacrylate, 2.0 g tricresyl phosphate, 2.0 g di-2-ethylhexyl phthalate, 1.0 g bis(2-o-chlorophenyl-4,5-diphenyl) imidazole, 0.05 g leuco crystal violet, 0.05 g benzotriazole, 0.0375 g C. I. Solvent Red 109, 0.0125 g Michler's ketone, and 1.5 ml of methylene chloride diluent. The product was pressure-filtered through a 100-mesh (149 μm) screen and evaculated to give a soft, thixotropic plastisol. The plastisol was coated at a thickness of 2.5 mm on polyethylene terephthalate film having a thickness of 0.125 mm and heated for 5 minutes at 120° C. It coalesced to a hard, dry coating that was suitable for use as a photoimageable printing plate.

In contrast, plastisols made from similar powders that were similarly prepared except that as little as $7\times10^{-5}$ g of sodium lauryl sulfate was incorporated in the polymerization medium were lumpy and difficult to disperse and filter.

EXAMPLE 25

To a solution of 0.6 g ammonium persulfate in 500 g of water was added 19 ml of a solution of 11 g methacrylic acid plus 1.1 g dodecyl mercaptan in 100 g methyl methacrylate. The suspension was stirred vigorously under nitrogen and heated at 80°–85° C. After 12 minutes, when the initial exotherm had subsided, the remainder of the methacrylic acid/dodecyl mercaptan/methyl methacrylate solution was added dropwise over a period of 8 hours. After further heating and stirring for 30 minutes, the resultant latex was evaporated under nitrogen with stirring at 56°–65° C. The residual powder weighed 100 g and comprised agglomerates of 0.3 μm spheres. It was comminuted in a mor-

TABLE 2

| Example | Monomer | Viscosity, cps. | | |
|---|---|---|---|---|
| | | Initial | After 4 hrs. | After 1 day |
| 11 | Trimethylolpropane triacrylate | 34,000 | 112,000 | >800,000 |
| 12 | Trimethylolpropane trimethacrylate | 6,200 | 10,440 | 35,000 |
| 13 | Hexamethylene glycol diacrylate | 3,400 | 27,000 | Partly set up |
| 14 | Hexamethylene glycol dimethacrylate | 1,800 | 15,550 | Partly set up |
| 15 | Decamethylene glycol dimethacrylate | 10,800 | 72,000 | Set up |
| 16 | Trimethylene glycol dimethacrylate | 13,400 | 268,000 | >800,000 |
| 17 | Triethylene glycol diacrylate | 15,200 | Set up | — |
| 18 | Triethylene glycol dimethacrylate | 8,800 | Set up | — |
| 19 | Polyethylene glycol diacrylate | 16,200 | 107,000 | — |
| 20 | Polyethylene glycol dimethacrylate | 11,700 | 165,200 | Set up |
| 21 | Pentaerythritol triacrylate | 32,400 | 118,000 | 458,000 |
| 22 | Ethoxylated trimethylolpropane triacrylate | 23,400 | Set up | — |
| 23 | Bis(6-methacryloxyhexyl) adipate | 17,600 | 126,000 | Set up |

EXAMPLE 24

To a solution of 0.4 g ammonium persulfate in 50 g of water was added 20 ml of a solution of 1.09 g dodecyl mercaptan plus 11 g methacrylic acid in 100 g methyl tar, held for 24 hours at room temperature over concentrated aqueous ammonium hydroxide and then dried for 24 hours at room temperature over sodium hydroxide pellets. Weight gain was 1.6% i.e., 70% of the theoretical amount for complete conversion of all —COOH groups to —COONH$_4$ groups. Predrying of the ammonia-treated powder was found to be necessary for the preparation of plastisols with best filterability and lowest ultimate viscosity. It was also found that, in general, such predrying should be carried out for a period at least as long as was the previous NH$_4$OH treatment.

The powder so prepared was used to make an organosol as described in Example 8, with the added precaution that the mixture was protected from ambient humidity by blanketing with dry nitrogen during the 0° C. milling step. This precaution served to improve filterability and reduce ultimate viscosity. After pressure-filtering through nylon flannel, the organosol had a viscosity of 200 cps. (Brookfield, No. 5 spindle, 100 rpm). It was then held under oil-pump vacuum at room temperature. After 20 minutes, the bubbles and diluent had been removed, and the final vacuum was 2 mm Hg. The residual plastisol was dilatant, with Brookfield No. 5 viscosities of 1176 cps. at 100 rpm and 832 cps. at 50 rpm. It was again pressure-filtered through nylon flannel and then coated at a thickness of 0.05 mm on 0.025 mm thick polyethylene terephthalate film and coalesced by passage at 3.6 m/min. through a 3.6 m tunnel at 100° C. The resultant 0.05 mm thick coating was smooth and uniform. It could be laminated, imaged, developed, etched and stripped as described in Example 6. The plastisol was stable for many months at room temperature without significant increase in viscosity, yet it could be readily coalesced when heated to 100°–120° C.

EXAMPLE 26

A seeded latex polymerization was carried out essentially as described in Example 8, except that the monomer mixture comprised a solution of 25 g ethyl acrylate plus 10 g methacrylic acid in 65 g methyl methacrylate. The resultant latex was dried under nitrogen with stirring at room temperature, mortared, passed through a 40-mesh (~0.38 mm) sieve and held for 18 hours over concentrated aqueous ammonium hydroxide. The powder had a glass transition temperature of 74° C. It was used to prepare an organosol as described in Example 8. The organosol could be coated, coalesced, laminated, imaged, developed and etched as described in Example 6.

EXAMPLE 27

A solution of 0.2 g ammonium persulfate in 100 g water was stirred under nitrogen and to it was added 29 ml of a solution of 5 g methacrylic acid plus 2 g dodecyl mercaptan in 95 g methyl methacrylate. The suspension was held at 80°–90° C. for 30 minutes then at 30-minute intervals there was added 20 ml of the methacrylic acid/dodecyl mercaptan/methyl methacrylate solution plus 80 ml of a solution of 0.1 g ammonium persulfate in 320 ml of water. Thirty minutes after the last addition, the latex was evaporated under nitrogen with stirring at 65° C. The resultant solid was mortared, passed through a 40-mesh (~0.38 mm) sieve, held one day over concentrated ammonium hydroxide, then one day over sodium hydroxide pellets.

A mixture of 87.5 g trimethylolpropane trimethacrylate, 20.0 g tricresyl phosphate, 10.0 g bis(2-o-chlorophenyl-4,5-diphenyl) imidazole, 0.5 g leuco crystal violet, 0.5 g benzotriazole, 0.375 g C.I. Solvent Red 109, and 0.125 g Michler's ketone was stirred for about 16 hours at room temperature, then milled for 30 minutes at 0° C. under nitrogen with 100 ml of 20–30 mesh (~0.55–0.85 mm) sand, and pressure-filtered through nylon flannel. An 11.9 g sample of this premix was stirred at 0° C. and 11.1 g of the polymer powder was added portionwise. The resultant soft paste was held for 20 hours at room temperature. It became a flowable dispersion with a Brookfield No. 5 viscosity of 15,440 cps. at 20 rpm. An equal volume of 20–30 mesh (~0.55–0.85 mm) sand was added, and the suspension was milled for 30 minutes at 0° C. under nitrogen. It was then pressure-filtered through a 325-mesh (44 μm) screen. The filtrate had a Brookfield No. 5 viscosity of 18,200 cps. and remainded uncoalesced for many days at room temperature. It could be coated, coalesced at 120° C., imaged, developed, etched and stripped as described in Examples 6 and 7.

EXAMPLE 28

To a solution of 0.2 g ammonium persulfate in 100 g water was added 29 ml of a solution of 5 g methacrylic acid and 2 g dodecyl mercaptan in 95 g methyl methacrylate. The suspension was blanketed with nitrogen, stirred and heated under reflux at 80°–90° C. At 30-minute intervals, there was added 20 ml of the methyl methacrylate/methacrylic acid/dodecyl mercaptan solution plus 80 ml of a solution of 0.1 g ammonium persulfate in 320 ml water. Thirty minutes after the fourth such addition, the reaction was terminated by opening to air and cooling to room temperature. A portion of the resultant milky latex was evaporated to dryness. The residue comprised 99% of the theoretical yield for complete polymerization.

A second polymerization was carried out as just described except that the initial charge comprised 0.2 g ammonium persulfate, 79.6 g water, and 20.4 g of the latex of the first polymerization to provide 4 g of polymer seed, i.e., 4% of the weight of the methyl methacrylate/methacrylic acid/dodecyl mercaptan used in the second polymerization.

After the second polymerization was complete, the latex was evaporated to dryness under nitrogen with stirring in a 55° C. water bath. The residue weighed 104 g (98% yield). It was ground in a mortar and passed through a 3.2 mm mesh sieve. A 33.5 g portion was loaded into a column and anhydrous ammonia gas was passed slowly through the bed of powder for 30 minutes.

A solution of 48 g tricresyl phosphate, 16.0 g benzophenone, 0.8 g Michler's ketone, 0.8 g bis(2o-chlorophenyl-4,5-diphenyl)imidazole, 0.8 g benzotriazole, 0.4 g tris(4-diethylamino-o-tolyl)methane, 0.2 g leuco crystal violet, and 0.25 g C.I. Basic Blue 7 (C.I. No. 42595) in 120 g trimethylolpropane triacrylate that contained 500 ppm hydroquinone was prepared by stirring for about 16 hours at room temperature. To 11.7 g of this solution there was added portionwise with stirring 12.5 g of the ammonia-treated binder powder. The suspension was cooled in an ice bath and blanketed with nitrogen, and 20 ml of 20–30 mesh (~0.55–0.85 mm) sand was added portionwise with disc-stirring at ~300 m/min. peripheral speed. After stirring for one hour, the plastisol was separated from the sand by filtration through nylon flannel and was found to have a Brookfield No. 5 viscosity of 820 cps. at 20 rpm initially, 1400 cps. after standing 24 hours at room temperature, and 2460 cps. after further stirring after 24 hours at room temperature. It was used to make photoimaging circuit board resists in the manner described in preceding examples.

Essentially similar results were obtained when the amount of seed polymer was varied between 1% and 5% of the amount of the plastisol-forming powder. Beyond those limits, diluent-free plastisols were much more difficult to filter.

EXAMPLE 29

A methyl methacrylate/methacrylic acid (90/10) copolymer ($\eta_{inh}=0.12$) was made by conventional suspension polymerization in water using poly(methacrylic acid) as the suspending agent. The resultant spherical particles were about 100-125 μm in diameter. The polymer was dry-milled in a ball mill with equal volume of flint pebbles having a diameter of ~12.5 mm for four days. The product was an impalpable powder of 2-20 μm particle size. The polymer powder was soluble at room temperature in methylene chloride, chloroform, 1,2-dichloroethane, 1,1,2-trichloroethane, and trichloroethylene. It was insoluble but swollen in methyl chloroform, perchloroethylene, and carbon tetrachloride. It was insoluble and not swollen in hexane.

An 11.1 g sample of the polymer powder was added to a prefiltered mixture of 1 g triethylene glycol diacetate, 3 g tricresyl phosphate, 8.75 g hexamethylene glycol dimethacrylate, 1 g bis[2-o-chlorophenyl-4,5-bis(m-methoxyphenyl)]imidazole, 0.05 g leuco crystal violet, 0.05 g benzotriazole, 0.0375 g C.I. Solvent Red 109 (C.I. No. 13900/45170), and 0.0125 g Michler's ketone. When the plastisol was held at room temperature with intermittent stirring, its viscosity (Brookfield, No. 5) was 864 cps. initially, 1652 cps. after one hour, and 42,240 cps. after one day. By comparison, a control sample of the same composition that was held at room temperature without stirring had a viscosity of 15,550 cps. after four hours, and after one day had set up to a nonfluid gel with a 0.5-cm. thick layer of fluid plastisol on the surface.

EXAMPLE 30

A solution of 31 g of ethyl acrylate plus 8 g of methacrylic acid in 61 g of methyl methacrylate was added to a solution of 0.6 g ammonium persulfate in 500 g water. The suspension was blanketed with nitrogen and stirred vigorously for two hours at 80°-85° C. The resultant latex was strained through nainsook fabric and held as "seed polymer latex".

A suspension of 30 g of the seed polymer latex in a solution of 0.6 g ammonium persulfate in 400 g water was blanketed with nitrogen, stirred vigorously, and heated to 40° C. To this was added a solution of 7.75 g ethyl acrylate, 2 g methacrylic acid and 0.975 g dodecyl mercaptan in 15.25 g methyl methacrylate. Three more such additions were made at one-hour intervals. Thirty minutes after the final addition, the latex was strained through nainsook fabric and held at room temperature for 10 days. It was then reheated to 40° C. under nitrogen and stirred and to it was added 5 g methacrylic acid, 0.1 g sodium bisulfite, and a solution of 0.1 g ammonium persulfate in 200 g water. After one hour at 40° C., the latex was evaporated under nitrogen with stirring at 25°-40° C. for two days. The residual solid was ground in a mortar, passed through a 40-mesh (~0.38 mm) screen, and held for 20 hours over concentrated aqueous ammonium hydroxide. Microscopic examination indicated a particle size of 0.5-0.9 μm.

An 11.1 g sample of the binder powder prepared as just described was added to a mixture of 8.75 g trimethylolpropane trimethacrylate, 2 g tricresyl phosphate, 1 g bis(2-o-chlorophenyl-4,5-diphenyl)imidazole, 0.05 g leuco crystal violet, 0.05 g benzotriazole, 0.0375 g C.I. Solvent Red 109, 0.0125 g Michler's ketone, and 7.5 ml carbon tetrachloride. An equal volume of 20-30 mesh (~0.55-0.85 mm) sand was added and the mixture was milled for 30 minutes at 0° C. with a disc impeller running at a peripheral speed of ~300 m/min. The resultant organosol remained fluid when held for one day at 5° C., but set up to a firm gel in two hours at room temperature.

EXAMPLE 31

A methyl methacrylate/methacrylic acid (93/7) copolymer powder was prepared by procedures like those of Example 26, using 93 g methyl methacrylate, 7 g methacrylic acid and 2 dodecyl mercaptan. The powder was isolated from the latex by drying at 55°-66° C., ground in a mortar, held for 24 hours over concentrated aqueous ammonium hydroxide, then held for 24 hours over sodium hydroxide pellets.

A mixture of 29 g trimethylolpropane triacrylate, 4.3 g dioctyl phthalate 4.3 g triethylene glycol diacetate, 4.3 g tricresyl phosphate, 4 g bis(2-o-chlorophenyl-4,5-diphenyl)imidazole, 0.2 g benzotriazole, 1 g Michler's ketone, 0.3 g tris(4-diethylamino-o-tolyl)-methane, 0.11 g leuco crystal violet, 0.03 g C.I. Basic Blue 7 (C.I. No. 42595) and 31.8 g methyl chloroform was stirred for 18 hours at room temperature, then pressure-filtered through nylon flannel.

A mixture of 19.95 g of this liquid premix, 13 g of the copolymer binder powder already described, and 25 ml of 20-30 mesh (~0.55-0.85 mm) sand was milled for 30 minutes at 0° C. under nitrogen, then pressure-filtered at 0° C. through nylon felt. The resulting organosol has viscosities of 200 cps. initially, 292 cps. after 5 hours at 5° C., and 824 cps. after 24 hours at 5° C. When the organosol was held at 25° C., viscosity rose as follows:
Initial: 300 cps.
After 15 min.: 344 cps.
After 30 min.: 520 cps.
After 1 hour: 1052 cps.
After 2.5 hours: 3560 cps.
After 5 hours: 86,400 cps.
After 6 hours: 380,000 cps.

I claim:

1. Thermally coalescible acrylic resin plastisol or organosol dispersion comprising particles having a mean diameter in the range of 0.1 to 20 μm of a single-phase, surfactant-free, homopolymer, random bipolymer or consisting of ethyl acrylate, methyl acrylate and methacrylic acid dispersed in a surfactant-free medium that comprises a compatible liquid plasticizer that is nonvolatile at room temperature and is not a monomer of any of the polymeric components, the weight ratio of said particles to said plasticizer being from 40/60 to 90/10.

2. A dispersion according to claim 1 wherein the acrylic resin is taken from polymers and copolymers of acrylic and methacrylic acids and esters of said acids.

3. A dispersion according to claim 1 wherein the mean diameter of the particles is in the range of 0.1 to 20 μm.

4. A dispersion according to claim 1 wherein the plasticizer is present in an amount of 40 to 60% by weight of the acrylic polymer or copolymer and plasticizer.

5. A dispersion according to claim 1 wherein there is present in the liquid phase a volatile component in an amount greater than 10% by weight based on the total dispersion weight.

6. A dispersion according to claim 5 wherein the volatile component is a solvent for the acrylic polymer component.

7. A dispersion according to claim 5 wherein the volatile component is a swelling agent for the acrylic polymer component.

* * * * *